(12) United States Patent
Jeng et al.

(10) Patent No.: US 12,266,681 B2
(45) Date of Patent: Apr. 1, 2025

(54) CAPACITOR DEVICE WITH MULTI-LAYER DIELECTRIC STRUCTURE

(71) Applicant: Taiwan Semiconductor Manufacturing Company, Ltd., Hsinchu (TW)

(72) Inventors: Yu-En Jeng, Taichung (TW); Hsiang-Ku Shen, Hsinchu (TW); Cheng-Hao Hou, Hsinchu (TW); Chen-Chiu Huang, Taichung (TW); Dian-Hau Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 438 days.

(21) Appl. No.: 17/569,279

(22) Filed: Jan. 5, 2022

(65) Prior Publication Data
US 2023/0154972 A1 May 18, 2023

Related U.S. Application Data

(60) Provisional application No. 63/279,374, filed on Nov. 15, 2021.

(51) Int. Cl.
*H10B 12/00* (2023.01)
*H01L 49/02* (2006.01)

(52) U.S. Cl.
CPC ......... *H01L 28/40* (2013.01); *H10B 12/0335* (2023.02)

(58) Field of Classification Search
CPC ......... H01L 28/40; H01L 28/56; H01L 28/75; H01L 28/87; H01L 28/91; H01L 28/55; H01L 28/65; H10B 53/00; H10B 12/0335; H10B 53/30
See application file for complete search history.

(56) References Cited

U.S. PATENT DOCUMENTS

| | | | |
|---|---|---|---|
| 2008/0121953 A1* | 5/2008 | Summerfelt | H01L 28/55 257/295 |
| 2020/0286984 A1* | 9/2020 | Chang | H10B 12/315 |
| 2023/0139254 A1* | 5/2023 | Wu | H10B 12/033 257/532 |

* cited by examiner

*Primary Examiner* — Nelson Garces
(74) *Attorney, Agent, or Firm* — Birch, Stewart, Kolasch & Birch, LLP (57) ABSTRACT

Structures of a semiconductor device structure are provided. The semiconductor device structure includes a first insulating layer formed over a semiconductor substrate and an interconnect structure formed in the first insulating layer. The semiconductor device structure also includes a second insulating layer formed over the first insulating layer and a capacitor device embedded in the second insulating layer. The capacitor device includes a first capacitor electrode layer electrically connected to the interconnect structure, a capacitor insulating stack formed over the first capacitor electrode layer and a second capacitor electrode layer formed over the capacitor insulating stack. The capacitor insulating stack includes first layers alternatingly stacked with second layers. The dielectric constant of the first layer is different than the dielectric constant of the second layer.

20 Claims, 4 Drawing Sheets

CAPACITOR DEVICE WITH MULTI-LAYER DIELECTRIC STRUCTURE

PRIORITY CLAIM AND CROSS-REFERENCE

This Application claims the benefit of U.S. Provisional Application No. 63/279,374, filed on Nov. 15, 2021, and entitled "CAPACITOR DEVICE WITH MULTI-LAYER DIELECTRIC STRUCTURE", the entirety of which is incorporated by reference herein.

BACKGROUND

The semiconductor industry has experienced rapid growth and demands for highly integrated semiconductor devices are increasing. Technological advances in integrated circuit (IC) design and materials have produced generations of ICs. Each generation has smaller and more complex circuits than previous generations.

Semiconductor devices may include active and/or passive devices such as transistors and capacitors. For example, the capacitors are a passive two-terminal electrical component used to store energy electro-statically in an electric field. The forms of practical capacitors vary widely, but all contain at least two electrical conductors separated by a dielectric (insulator). Capacitors are widely used in electronic circuits, such as in a memory device. For integrated circuits and for DRAM devices in particular, the use of metal-insulator-metal (MIM) capacitors has become widespread in recent years.

Although existing MIM capacitors and methods of fabricating those capacitors have been generally adequate for their intended purposes, they have not been entirely satisfactory in all respects. For example, although the MIM capacitor with thin insulator provides a large capacitance, large leakage current may be induced due to the thin capacitor insulator.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments for manufacturing semiconductor device structures are provided. The semiconductor device structures may include a capacitor device, such as a metal-insulator-metal (MIM) or metal-insulator-semiconductor (MIS) capacitor, which is embedded in an insulating layer over a semiconductor substrate and electrically connected to a conductive feature and/or an interconnect structure thereunder. The capacitor device includes an insulating stack formed between two electrodes and including first layers alternatingly arranged with second layers. A dielectric constant and/or a lattice constant of the first layer are different than a dielectric constant and/or a lattice constant of the second layer.

In the insulating stack, the lowermost layer (e.g., the first or second layer) exerts a tensile or compressive stress on the overlying layers, so that the formed insulating stack has a monoclinic or tetragonal crystal phase. As a result, the capacitor insulating stack can provide a higher dielectric constant than a single bulk capacitor insulator. When the capacitor insulating stack and the single bulk capacitor insulator have the same thickness, larger capacitance can be obtained in the capacitor device with the capacitor insulating stack.

In addition, the grain sizes of the first layer and the second layer in the capacitor insulating stack are smaller than that of the single bulk capacitor insulator. As a result, the grain boundaries in the capacitor insulating stack are smaller than those of the single bulk capacitor insulator, thereby reducing the leakage path. Therefore, lower leakage current can also be obtained in the capacitor device with the capacitor insulating stack.

Embodiments for a semiconductor device structure and method for forming the same are provided. FIGS. 1A to 1E show cross-sectional views of various stages of a semiconductor device structure 200, in accordance with some embodiments. In some embodiments, the semiconductor device structure 200 includes a capacitor device 140 (such as a MIM or MIS capacitor device) formed over semiconductor devices, such as planar transistors with multiple interconnection layers formed thereover in later figures. In some other embodiments, the semiconductor devices are fin field effect transistors (FinFETs), gate-all-around (GAA) transistors, or other types of active devices. The semiconductor devices are formed by the front-end of line (FEOL) process. The overlying capacitor device 140 are formed by the back-end of line (BEOL) process that includes the formation of the multiple interconnection layers to be electrically connected between the one or more semiconductor devices (e.g., the transistors) and the capacitor device 140.

Figure 1A:
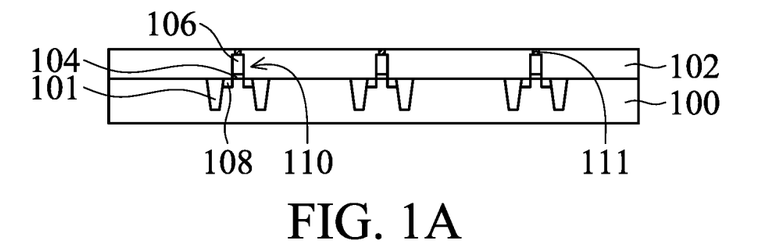
FIGS. 1A to 1E show cross-sectional views of various stages of a semiconductor device structure having a capacitor device, in accordance with some embodiments.

In some embodiments, a substrate 100, such as a bulk semiconductor substrate or a silicon-on-insulator (SOI) substrate is provided, as shown in FIG. 1A. An SOI substrate includes an insulator layer below a thin semiconductor layer that is the active layer of the SOI substrate. The semiconductor of the active layer and the bulk semiconductor generally includes the crystalline semiconductor material silicon. Alternatively or additionally, the substrate 100 may include other elementary semiconductor materials (e.g., germanium). In some embodiments, the substrate 100 is made of a compound semiconductor (e.g., GaAs, AlAs, InAs, GaN, MN, InP, SiC or the like). In some embodiments, the substrate 100 is made of an alloy semiconductor such as silicon germanium, silicon germanium carbide, gallium arsenic phosphide, or gallium indium phosphide. In some embodiments, the substrate 100 includes an epitaxial layer. For example, the substrate 100 has an epitaxial layer overlying a bulk semiconductor. The semiconductor materials mentioned above may be doped or undoped. Other substrates that may be used include multi-layered substrates, gradient substrates, or hybrid orientation substrates.

An isolation structure 101, such as shallow trench isolation (STI) structures is formed in the substrate 100 to isolate the semiconductor devices in the substrate 100, as shown in FIG. 1A in accordance with some embodiments. In some embodiments, an insulating layer 102 is formed over the top surface of the substrate 100 and gate structures 110 are embedded in the insulating layer 102, after the formation of the isolation structure 101.

In some embodiments, the gate structure 110 includes a gate dielectric layer 104 and a gate electrode layer 106 formed over the gate dielectric layer 104. Source and drain regions 108 are formed in the substrate 100 and next to the corresponding gate structure 110 prior to the formation of the insulating layer 102 and after the formation of the gate structures 110. The gate structure 110 embedded in the insulating layer 102 and the corresponding source and drain regions 108 formed in the substrate 100 forms a transistor. Afterwards, contact structures 111 (such as contact plugs) are formed in the insulating layer 102 and electrically coupled to the underlying gate structures 110, respectively.

In some embodiments, the insulating layer 102 is an inter-layer dielectric (ILD) layer that is formed over the substrate 100 and fills the space between the gate structures 110 of transistors. The insulating layer 102 is employed to electrically isolate the substrate 100 from the overlying conductive features/layers. In some embodiments, the insulating layer 102 includes silicon oxide, silicon nitride ($Si_xN_y$), silicon oxynitride, silicon nitride ($Si_xN_y$), silicon carbon nitride, tetraethoxysilane (TEOS) oxide, phospho silicate glass (PSG), boro silicate glass (BSG), boron-doped phospho silicate glass (BPSG), fluorine-doped silicate glass (FSG), or the like, or a combination thereof. The insulating layer 102 may be formed by chemical vapor deposition (CVD), flowable CVD (FCVD), plasma enhanced CVD (PECVD), low pressure CVD (LPCVD), atomic layer deposition (ALD), physical vapor deposition (PCD), spin-on coating, or any other suitable deposition process.

In some embodiments, the contact structures 111 formed in the insulating layer 102 are also used to electrically connect the gate structures 110 to the overlying metal lines and vias. The contact structures 111 are formed of a conductive material, such as tungsten, aluminum, copper, titanium, tantalum, titanium nitride, tantalum nitride, or alloys thereof. The formation of the contact structures 111 may include forming contact openings in the insulating layer 102, filling a conductive material into the contact openings, and performing a planarization process (such as a chemical mechanical polishing (CMP) process or a mechanical grinding process) to substantially level the top surfaces of the contact structures 111 with the top surface of the insulating layer 102.

Figure 1B:
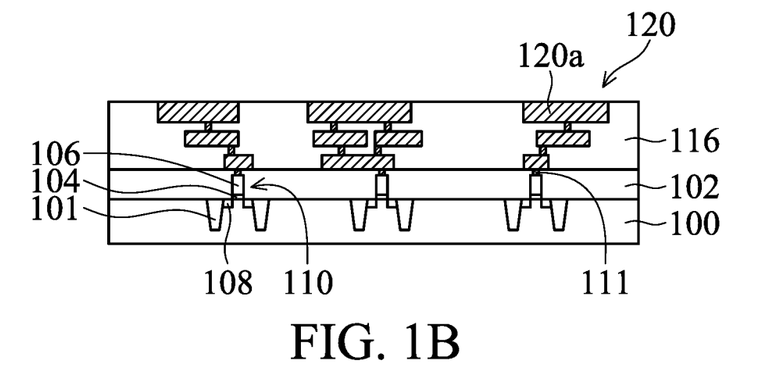

After the contact structures 111 are formed, an insulating layer 116 and an interconnect structure 120 are successively formed over the insulating layer 102, as shown in FIG. 1B in accordance with some embodiments. The interconnect structure 120 that is electrically connected to the contact structures 111 may be used as a redistribution (RDL) structure for routing. The interconnect structure 120 includes multiple metal lines and vias formed in insulating layer 116 (also referred to as an inter-metal dielectric (IMD) layer). The metal lines at the same level are collectively referred to as a metal layer hereinafter. In some embodiments, the interconnect structure 120 has metal layers that include the uppermost metal layer 120a, and which are interconnected by conductive vias. The metal layers and conductive vias may be formed of copper or copper alloys, but they can also be formed of other metals.

The insulating layer 116 may be a single layer or a multi-layer structure and be formed of silicon oxide, silicon carbide (SiC), silicon nitride ($Si_xN_y$), silicon oxynitride, or low-k dielectric materials. The low dielectric constant (low-k) dielectric materials may include a carbon-containing low-k dielectric material, hydrogen silsesquioxane (HSQ), methylsilsesquioxane (MSQ), or the like. The insulating layer 116 may be formed by chemical vapor deposition (CVD), flowable CVD (FCVD), plasma enhanced CVD (PECVD), low pressure CVD (LPCVD), atomic layer deposition (ALD), physical vapor deposition (PCD), spin-on coating, or any other suitable deposition process.

The formation of metal layers and vias may include single damascene processes and/or dual damascene processes. In a single damascene process, trenches are first formed in the insulating layer 116, followed by filling the trenches with a conductive material. A planarization process (e.g., a chemical mechanical polishing (CMP) process or a mechanical grinding process) is then performed to remove any excess portions of the conductive material that is higher than the top surface of the insulating layer 116, leaving a metal layer in each of the trenches.

In addition, in a dual damascene process, both trench and via openings are formed in the insulating layer 116r, with the via opening underlying and connected to the corresponding trench. The conductive material is then filled into the trenches and the via openings to form a metal layer and vias. The conductive material may include a diffusion barrier layer and a metal material over the diffusion barrier layer. The metal material may be made of copper (Cu), copper alloy, aluminum (Al), aluminum alloy, tungsten (W), tungsten alloy, titanium (Ti), titanium alloy, tantalum (Ta) or tantalum alloy. The metal layers and vias may be formed by electroplating, electroless plating, printing, chemical vapor deposition (CVD), or physical vapor deposition (PVD). The diffusion barrier layer may include titanium, titanium nitride, tantalum, tantalum nitride, or the like.

Figure 1C:
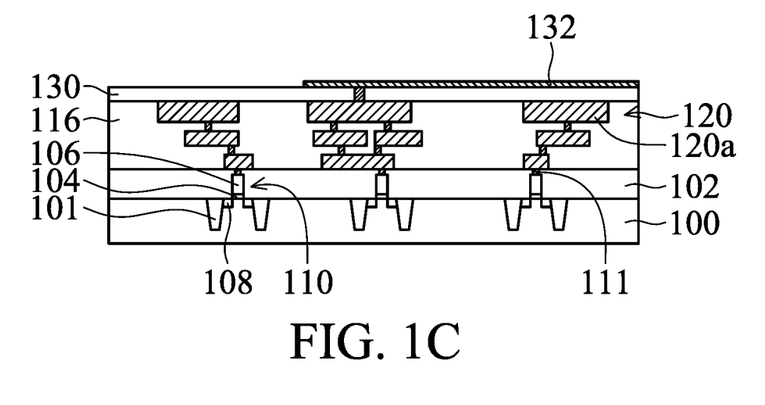
Figure 1D:
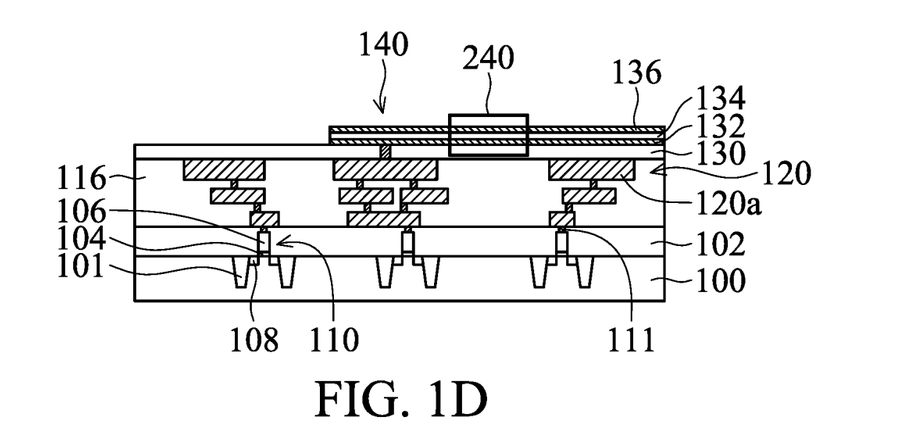

After the interconnect structure 120 is formed, a capacitor device 140 is formed over the interconnect structure 120 and electrically connected to the interconnect structure 120, as shown in FIGS. 1C to 1D in accordance with some embodiments. In some embodiments, an optional etching stop layer (not shown) is formed over the interconnect structure 120, and an insulating layer 130 is formed over the etching stop layer, as shown in FIG. 1C. The etching stop layer may be made of silicon carbide (SiC), silicon nitride ($Si_xN_y$), silicon carbonitride (SiCN), silicon oxycarbide (SiOC), silicon oxycarbon nitride (SiOCN), or another applicable material. The etching stop layer may be formed by a deposition process, such as chemical vapor deposition (CVD), physical vapor deposition (PVD), atomic layer deposition (ALD), or another applicable process. In addition, the insulating layer 130 may be made of undoped silicate glass (USG), silicon oxide, or another applicable material. The insulating layer 130 may be formed by a deposition process, such as chemical vapor deposition (CVD), physical vapor deposition (PVD), atomic layer deposition (ALD), or another applicable process.

Afterwards, a capacitor electrode layer 132 is formed over the insulating layer 130 and electrically connected to the underlying interconnect structure 120 through one or more vias formed in the insulating layer 130, in accordance with some embodiments. The capacitor electrode layer 132 is also referred to as a bottom electrode layer of the subsequently formed capacitor device. The capacitor electrode layer 132 is made of a conductive material, such as a metal material, a metal alloy material, or a doped semiconductor material. For an example, the capacitor electrode layer 132 is made of a metal or metal alloy, including titanium (Ti), tantalum (Ta), copper (Cu), platinum (Pt), tungsten (W), aluminum (Al), titanium nitride (TiN), tantalum nitride (TaN), tantalum aluminum nitride (TaAlN), copper alloy, aluminum (Al) alloy, copper aluminum alloy (AlCu), or tungsten (W) alloy or another applicable material. For another example, the capacitor electrode layer 132 is made of a group IV semiconductor material (e.g., Si, Ge, or SiGe) or a group III-V semiconductor material (e.g., GaAs, GaN, InGaAs, or InGaN) that is heavily doped with p-type or n-type dopants.

The formation of the capacitor electrode layer 132 includes deposition, photolithography, and etching processes. The deposition processes include chemical vapor deposition (CVD), physical vapor deposition (PVD), atomic layer deposition (ALD), or another applicable process. The photolithography processes include photoresist coating (e.g., spin-on coating), soft baking, mask aligning, exposure, post-exposure baking, developing photoresist, rinsing and drying (e.g., hard baking). The etching process includes a dry etching process or a wet etching process. In some embodiments, after the photolithography processes, a cleaning process is performed to remove some residue remaining on the capacitor electrode layer 132.

Afterwards, a capacitor insulating stack 134 is formed over the capacitor electrode layer 132, and a capacitor electrode layer 136 is formed over the capacitor insulating stack 134, as shown in FIG. 1D in accordance with some embodiments of the disclosure. In some embodiments, the capacitor electrode layer 136 is also referred to as a top electrode layer of the subsequently formed capacitor device. The capacitor electrode layer 136 is made of a conductive material, such as a metal material, a metal alloy material, or a doped semiconductor material. For an example, the capacitor electrode layer 136 is made of a metal or metal alloy, including titanium (Ti), tantalum (Ta), copper (Cu), platinum (Pt), tungsten (W), aluminum (Al), titanium nitride (TiN), tantalum nitride (TaN), tantalum aluminum nitride (TaAlN), copper alloy, aluminum (Al) alloy, copper aluminum alloy (AlCu), or tungsten (W) alloy or another applicable material. For another example, the capacitor electrode layer 136 is made of a group IV semiconductor material (e.g., Si, Ge, or SiGe) or a group III-V semiconductor material (e.g., GaAs, GaN, InGaAs, or InGaN) that is heavily doped with p-type or n-type dopants.

The formation of the capacitor electrode layer 136 includes deposition, photolithography, and etching processes. The deposition processes include chemical vapor deposition (CVD), physical vapor deposition (PVD), atomic layer deposition (ALD), or another applicable process. The etching process includes a dry etching process or a wet etching process. In some embodiments, after the photolithography processes, a cleaning process is performed to remove some residue remaining on the capacitor electrode layer 136.

The capacitor device 140 includes the capacitor electrode layer 132, the capacitor insulating stack 134, and the capacitor electrode layer 136 to form an MIM or MIS capacitor device. The capacitor electrode layer 132 is a bottom electrode of the capacitor device 140, and the capacitor electrode layer 136 is the top electrode of the capacitor device 140. The capacitor device 140 is electrically connected to the uppermost metal layer 120a of the interconnect structure 120 through one or more vias formed between the capacitor electrode layer 132 and the interconnect structure 120 in accordance with some embodiments. In some other embodiments, the capacitor device 140 is electrically connected to another interconnect structure (not shown) that is formed in the subsequently formed insulating layer over the insulating layer 130 and is electrically connected to the uppermost metal layer 120a of the interconnect structure 120.

In some embodiments, the capacitor insulating stack 134 has a multi-layer structure and is made of high-k dielectric materials. The high-k dielectric material has a dielectric constant (k value) that is substantially equal to or greater than 4. Examples of high-k dielectric material may include hafnium oxide ($HfO_2$), zirconium oxide ($ZrO_2$), aluminum oxide ($Al_2O_3$), lanthanum oxide ($La_2O_3$), lanthanum aluminum oxide ($LaAlO_3$), titanium oxide ($Ti_xO_y$, wherein x is a real number and y is a real number), tantalum oxide ($Ta_xO_y$, wherein x is a real number and y is a real number), titanium oxide nitride ($Ti_xO_yN_z$, wherein x is a real number, y is a real number and z is a real number), tantalum oxide nitride ($Ta_xO_yN_z$, wherein x is a real number, y is a real number and z is a real number) and the like.

In some embodiments, the capacitor insulating stack 134 that has a multi-layer structure includes first layers (which are also referred to first capacitor dielectric layers) alternatingly stacked with second layers (which are also referred to second capacitor dielectric layers). Moreover, the first capacitor dielectric layer is made of a different material than the second capacitor dielectric layer. As a result, the dielectric constant of the first capacitor dielectric layer is different than the dielectric constant of the second capacitor dielectric layer. Moreover, the lattice constant of the first capacitor dielectric layer is also different than the lattice constant of the second capacitor dielectric layer.

Figure 2:
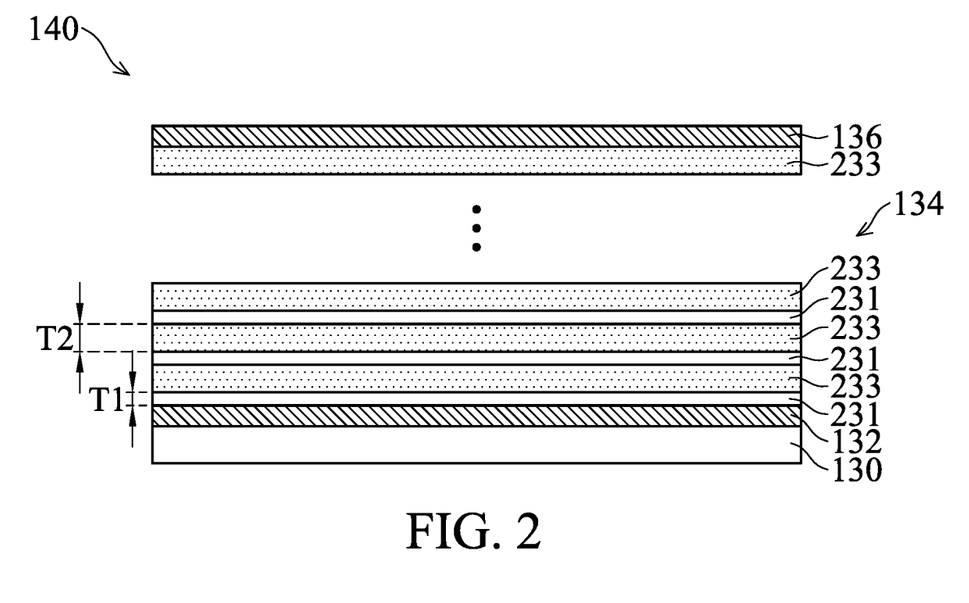
FIG. 2 shows an enlarged cross-sectional view of a region 240 shown in FIG. 1D, in accordance with some embodiments.

FIG. 2 shows an enlarged cross-sectional view of a region 240 shown in FIG. 1D, in accordance with some embodiments. The region 240 shows the detailed configuration of the capacitor insulating stack 134 shown in FIG. 1D, in accordance with some embodiments. As shown in FIG. 2, the capacitor insulating stack 134 formed between the capacitor electrode layer 132 and the capacitor electrode layer 136 includes capacitor dielectric layers 231 alternatingly stacked with capacitor dielectric layers 233. In some embodiments, the number of capacitor dielectric layers 231 is equal to the number of capacitor dielectric layers 233, and the number of capacitor dielectric layers 231 is greater than 2 (e.g., 3, 4, 5, 6, and so forth). In those cases, one of the capacitor dielectric layers 231 (e.g., the lowermost layer of the capacitor dielectric layers 231) is in direct contact with the capacitor electrode layer 132, and one of the capacitor dielectric layers 233 (e.g., the uppermost layer of the capacitor dielectric layers 233) is between and in direct contact with the capacitor electrode layer 136 and one of the capacitor dielectric layers 231 (e.g., the uppermost layer of the capacitor dielectric layers 231).

In some embodiments, each of the capacitor dielectric layers 231 has a thickness T1 and each of the capacitor dielectric layers 233 has a thickness T2 different than the thickness T1. For example, the capacitor dielectric layer 231 is made of $HfO_2$, and the capacitor dielectric layer 233 is made of $ZrO_2$. In this case, the dielectric constant of the capacitor dielectric layer 231 is lower than the dielectric constant of the capacitor dielectric layer 233. Further, the lattice constant of the capacitor dielectric layer 231 is also lower than the lattice constant of the capacitor dielectric layer 233. In addition, the thickness T1 of the capacitor dielectric layer 231 is less than the thickness T2 of the capacitor dielectric layer 233.

In such a configuration of the capacitor insulating stack 134, the capacitor dielectric layers 231 alternatingly arranged with capacitor dielectric layers 233 form a superlattice multi-layer structure that separates the capacitor electrode layer 132 and the capacitor electrode layer 136. The lowermost capacitor dielectric layers 231 may exert a compressive stress to the overlying deposited capacitor dielectric layers, so that the lattice structure of the capacitor insulating stack 134 has a tetragonal crystal phase. As a result, the capacitor insulating stack 134 provides a higher dielectric constant than a single bulk capacitor insulator used in the typical MIM or MIS capacitor device. Therefore, the capacitance of the capacitor device 140 with the capacitor insulating stack 134 can be improved.

In addition, the grain sizes of the capacitor dielectric layers 231 and 233 can be reduced, so that the grain sizes of the capacitor dielectric layers 231 and 233 are smaller than the grain size of the single bulk capacitor insulator used in the typical MIM or MIS capacitor device. As a result, the grain boundaries in capacitor dielectric layers 231 and 233 are smaller than those of the single bulk capacitor insulator in the typical MIM or MIS capacitor device, thereby reducing the leakage path. Therefore, lower leakage current can also be obtained in the capacitor device 140 with the capacitor insulating stack 134.

Figure 3:
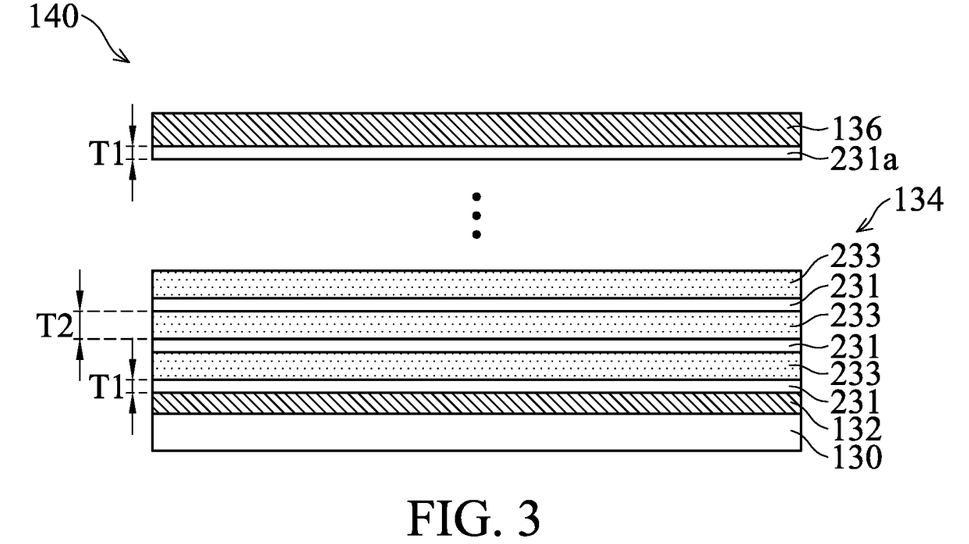
FIG. 3 shows an enlarged cross-sectional view of a region 240 shown in FIG. 1D, in accordance with some embodiments.

Many variations and/or modifications can be made to embodiments of the disclosure. For example, the configuration of the capacitor insulating stack 134 shown in FIG. 2 includes the lowermost layer of the capacitor dielectric layers 231 in direct contact with the capacitor electrode layer 132, and the uppermost layer of the capacitor dielectric layers 233 in direct contact with the capacitor electrode layer 136, but embodiments of the disclosure are not limited thereto. FIG. 3 shows an enlarged cross-sectional view of a region 240 shown in FIG. 1D, in accordance with some embodiments. Similarly, the materials and formation methods of the capacitor insulating stack shown in FIG. 2 may also be applied in the embodiments illustrated in FIG. 3, and may be therefore not repeated.

As shown in FIG. 3, the capacitor insulating stack 134 formed between the capacitor electrode layer 132 and the capacitor electrode layer 136 includes capacitor dielectric layers 231 alternatingly stacked with capacitor dielectric layers 233. Moreover, the capacitor insulating stack 134 further includes a capacitor dielectric layer 231a formed over the capacitor dielectric layers 231 and 233. In some embodiments, the capacitor dielectric layer 231a is made of a material that is the same as the material of the capacitor dielectric layer 231. That is, the capacitor dielectric layer 231a can serve as an additional capacitor dielectric layer 231.

Similarly, the number of capacitor dielectric layers 231 is equal to the number of capacitor dielectric layers 233, and the number of capacitor dielectric layers 231 is greater than 2. In those cases, one of the capacitor dielectric layers 231 (e.g., the lowermost layer of the capacitor dielectric layers 231) is in direct contact with the capacitor electrode layer 132, and the capacitor dielectric layer 231a is between and in direct contact with the capacitor electrode layer 136 and one of the capacitor dielectric layers 233 (e.g., the uppermost layer of the capacitor dielectric layers 233).

In some embodiments, each of the capacitor dielectric layers 231 and the capacitor dielectric layer 231a has a thickness T1 and each of the capacitor dielectric layers 233 has a thickness T2 different than the thickness T1. For example, the capacitor dielectric layer 231 and the capacitor dielectric layer 231a are made of $HfO_2$, and the capacitor dielectric layer 233 is made of $ZrO_2$.

In such a configuration of the capacitor insulating stack 134, the capacitor dielectric layers 231, 233 and 231a form a superlattice multi-layer structure that separates the capacitor electrode layer 132 and the capacitor electrode layer 136. Similarly, the lattice structure of the capacitor insulating stack 134 shown in FIG. 3 has a tetragonal crystal phase.

Compared to the typical MIM or MIS capacitor device using the single bulk capacitor insulator, the capacitance of the capacitor device 140 with the capacitor insulating stack 134 can be improved, while reducing the leakage current.

Figure 4:
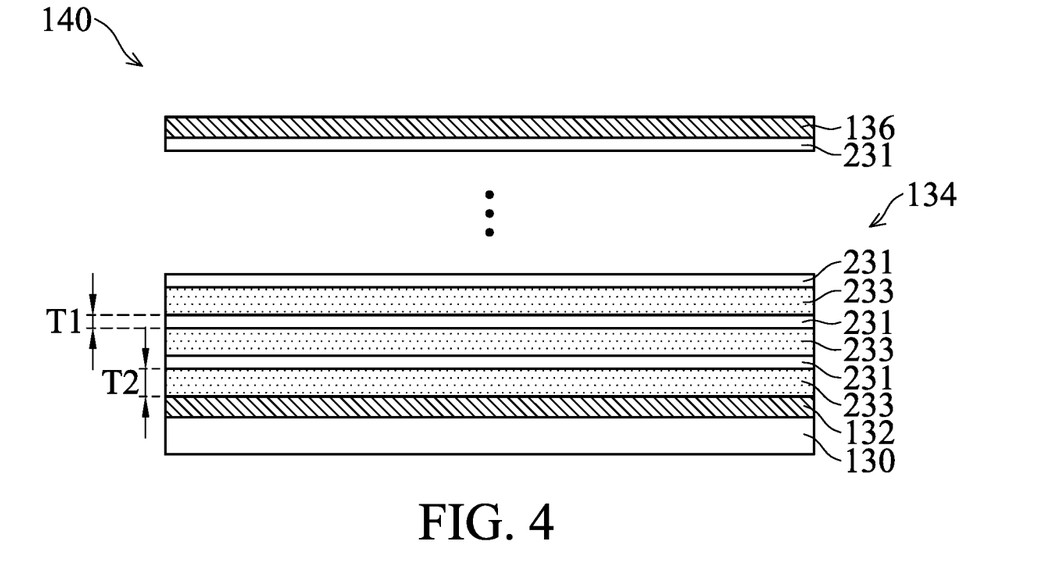
FIG. 4 shows an enlarged cross-sectional view of a region 240 shown in FIG. 1D, in accordance with some embodiments.

Many variations and/or modifications can be made to embodiments of the disclosure. For example, the configuration of the capacitor insulating stack 134 shown in FIG. 2 includes the lowermost layer of the capacitor dielectric layers 231 in direct contact with the capacitor electrode layer 132, and the uppermost layer of the capacitor dielectric layers 233 in direct contact with the capacitor electrode layer 136, but embodiments of the disclosure are not limited thereto. FIG. 4 shows an enlarged cross-sectional view of a region 240 shown in FIG. 1D, in accordance with some embodiments. Similarly, the materials and formation methods of the capacitor insulating stack shown in FIG. 2 may also be applied in the embodiments illustrated in FIG. 4, and may be therefore not repeated.

As shown in FIG. 4, the capacitor insulating stack 134 formed between the capacitor electrode layer 132 and the capacitor electrode layer 136 includes capacitor dielectric layers 233 alternatingly stacked with capacitor dielectric layers 231. Similarly, the number of capacitor dielectric layers 233 is equal to the number of capacitor dielectric layers 231, and the number of capacitor dielectric layers 233 is greater than 2 (e.g., 3, 4, 5, 6, and so forth). In those cases, one of the capacitor dielectric layers 233 (e.g., the lowermost layer of the capacitor dielectric layers 233) is in direct contact with the capacitor electrode layer 132, and one of the capacitor dielectric layers 231 (e.g., the uppermost layer of the capacitor dielectric layers 231) is between and in direct contact with the capacitor electrode layer 136 and one of the capacitor dielectric layers 233 (e.g., the uppermost layer of the capacitor dielectric layers 233).

In some embodiments, each of the capacitor dielectric layers 231 has a thickness T1 and each of the capacitor dielectric layers 233 has a thickness T2 different than the thickness T1. For example, the capacitor dielectric layer 231 is made of $HfO_2$, and the capacitor dielectric layer 233 is made of $ZrO_2$. In this case, the thickness T1 of the capacitor dielectric layer 231 is less than the thickness T2 of the capacitor dielectric layer 233.

In such a configuration of the capacitor insulating stack 134, the capacitor dielectric layers 233 alternatingly arranged with capacitor dielectric layers 231 also form a superlattice multi-layer structure that separates the capacitor electrode layer 132 and the capacitor electrode layer 136. The lowermost capacitor dielectric layers 233 may exert a tensile stress to the overlying deposited capacitor dielectric layers, so that the lattice structure of the capacitor insulating stack 134 has a monoclinic crystal phase. As a result, the capacitor insulating stack 134 provides a higher dielectric constant than a single bulk capacitor insulator used in the typical MIM or MIS capacitor device, but a lower dielectric constant than the configuration of the insulating stack 134 shown in FIGS. 2 and 3. Therefore, the capacitance of the capacitor device 140 with the capacitor insulating stack 134 can be improved compared to the typical MIM or MIS capacitor device using the single bulk capacitor insulator.

In addition, the lattice structure of the capacitor insulating stack 134 shown in FIG. 4 has a monoclinic crystal phase, rather than a tetragonal crystal phase, the grain sizes of the capacitor dielectric layers 231 and 233 can be further reduced as compared to those shown in FIGS. 2 and 3. Therefore, the leakage current can be reduced further.

Many variations and/or modifications can be made to embodiments of the disclosure. For example, the configuration of the capacitor insulating stack 134 shown in FIG. 4 includes the lowermost layer of the capacitor dielectric layers 233 in direct contact with the capacitor electrode layer 132, and the uppermost layer of the capacitor dielectric layers 231 in direct contact with the capacitor electrode layer 136, but embodiments of the disclosure are not limited thereto. FIG. 4 shows an enlarged cross-sectional view of a region 240 shown in FIG. 1D, in accordance with some embodiments. Similarly, the materials and formation methods of the capacitor insulating stack shown in FIG. 4 may also be applied in the embodiments illustrated in FIG. 5, and may be therefore not repeated.

Figure 5:
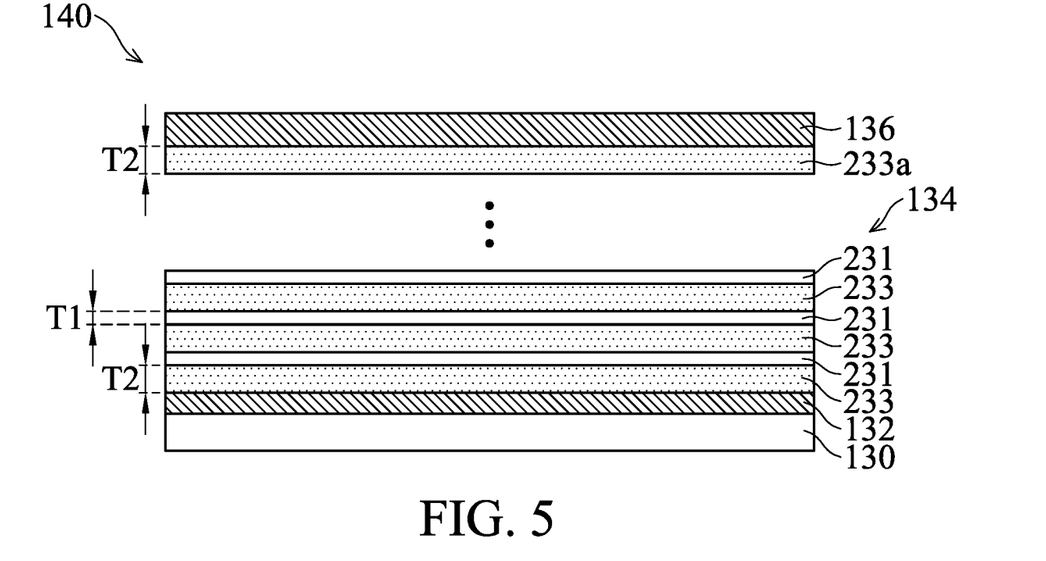
FIG. 5 shows an enlarged cross-sectional view of a region 240 shown in FIG. 1D, in accordance with some embodiments.

As shown in FIG. 5, the capacitor insulating stack 134 formed between the capacitor electrode layer 132 and the capacitor electrode layer 136 includes capacitor dielectric layers 233 alternatingly stacked with capacitor dielectric layers 231. Moreover, the capacitor insulating stack 134 further includes a capacitor dielectric layer 233a formed over the capacitor dielectric layers 233 and 231. In some embodiments, the capacitor dielectric layer 233a is made of a material that is the same as the material of the capacitor dielectric layer 233. That is, the capacitor dielectric layer 233a can serve as an additional capacitor dielectric layer 233.

Similarly, the number of capacitor dielectric layers 231 is equal to the number of capacitor dielectric layers 233, and the number of capacitor dielectric layers 231 is greater than 2. In those cases, one of the capacitor dielectric layers 233 (e.g., the lowermost layer of the capacitor dielectric layers 233) is in direct contact with the capacitor electrode layer 132, and the capacitor dielectric layer 233a is between and in direct contact with the capacitor electrode layer 136 and one of the capacitor dielectric layers 231 (e.g., the uppermost layer of the capacitor dielectric layers 231).

In some embodiments, each of the capacitor dielectric layers 233 and the capacitor dielectric layer 233a has a thickness T2 and each of the capacitor dielectric layers 231 has a thickness T1 different than the thickness T2. For example, the capacitor dielectric layer 233 and the capacitor dielectric layer 233a are made of $ZrO_2$, and the capacitor dielectric layer 231 is made of $HfO_2$.

In such a configuration of the capacitor insulating stack 134, the capacitor dielectric layers 233, 231 and 233a form a superlattice multi-layer structure that separates the capacitor electrode layer 132 and the capacitor electrode layer 136. Similarly, the lattice structure of the capacitor insulating stack 134 shown in FIG. 5 has a monoclinic crystal phase. Compared to the typical MIM or MIS capacitor device using the single bulk capacitor insulator, the capacitance of the capacitor device 140 with the capacitor insulating stack 134 can be improved, while reducing the leakage current.

Figure 1E:
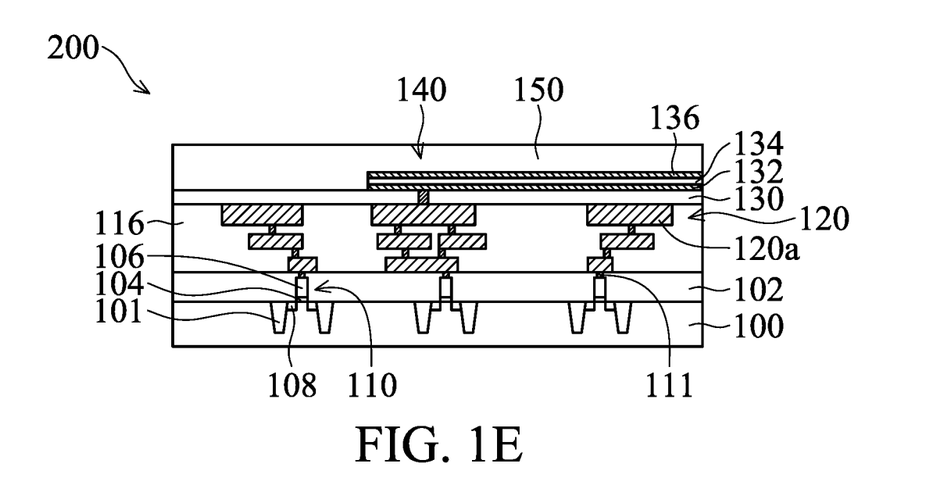

After the capacitor device 140 is formed, an insulating layer 150 is formed over the capacitor device 140, as shown in FIG. 1E in accordance with some embodiments. In some embodiments, the material and the method used for formation of the insulating layer 150 are the same as or similar to those used for formation of the insulating layer 116 and/or the insulating layer 130. For example, the insulating layer 150 (also referred to as an IMD layer) may be a single layer or a multi-layer structure and be formed of silicon oxide, silicon carbide (SiC), silicon nitride ($Si_xN_y$), silicon oxynitride, or low-k dielectric materials. The low dielectric constant (low-k) dielectric materials may include a carbon-containing low-k dielectric material, hydrogen silsesquioxane (HSQ), methylsilsesquioxane (MSQ), or the like. The insulating layer 150 may be formed by chemical vapor deposition (CVD), flowable CVD (FCVD), plasma enhanced CVD (PECVD), low pressure CVD (LPCVD), atomic layer deposition (ALD), physical vapor deposition (PCD), spin-on coating, or any other suitable deposition process.

In some other embodiments, the insulating layers 130 and 142 are sometimes collectively referred to as a passivation structure. Therefore, the capacitor device 140 is embedded in the passivation structure that includes the insulating layers 130 and 142.

Embodiments of a semiconductor device structure are provided. The semiconductor device structure includes a capacitor device formed in an insulating layer on a semiconductor substrate. The capacitor device includes a first electrode layer, a capacitor insulating stack formed over the first electrode layer, and a second electrode layer formed over the capacitor insulating stack. The capacitor insulating stack includes first layers alternatingly stacked with second layers. A dielectric constant and/or a lattice constant of the first layer are different than a dielectric constant and/or a lattice constant of the second layer. The first layers alternatingly stacked with second layers form a superlattice multi-layer structure. In the superlattice multi-layer structure, the lowermost layer (e.g., the first or second layer) exerts a tensile or compressive stress on the overlying layers, so that the formed capacitor insulating stack has a monoclinic or tetragonal crystal phase. As a result, the capacitor insulating stack can provide a higher dielectric constant than a single bulk capacitor insulator. Therefore, when the capacitor insulating stack and the single bulk capacitor insulator have the same thickness, larger capacitance can be obtained in the capacitor device with the capacitor insulating stack. Moreover, the grain sizes of the first layer and the second layer in the capacitor insulating stack are smaller than that of the single bulk capacitor insulator. As a result, the grain boundaries in the capacitor insulating stack are smaller than those of the single bulk capacitor insulator, thereby reducing the leakage path. Therefore, lower leakage current can also be obtained in the capacitor device with the capacitor insulating stack.

In some embodiments, a semiconductor device structure is provided. The semiconductor device structure includes a first insulating layer formed over a semiconductor substrate and an interconnect structure formed in the first insulating layer. The semiconductor device structure also includes a second insulating layer formed over the first insulating layer and a capacitor device embedded in the second insulating layer. The capacitor device includes a first capacitor electrode layer electrically connected to the interconnect structure, a capacitor insulating stack formed over the first capacitor electrode layer and a second capacitor electrode layer formed over the capacitor insulating stack. The capacitor insulating stack includes first layers alternatingly stacked with second layers. The dielectric constant of the first layer is different than the dielectric constant of the second layer.

In some embodiments, a semiconductor device structure is provided. The semiconductor device structure includes an insulating layer formed over a semiconductor substrate. The semiconductor device structure also includes a capacitor device embedded in the insulating layer. The capacitor device includes a first metal electrode layer, a second metal electrode layer formed over the first metal electrode layer, and first capacitor dielectric layers alternatingly stacked with second capacitor dielectric layers. The first capacitor dielectric layers and the second capacitor dielectric layers are formed between the first metal electrode layer and the second metal electrode layer, and the first capacitor dielectric layer is made of $HfO_2$, and the second capacitor dielectric layer is made of $ZrO_2$.

In some embodiments, a semiconductor device structure is provided. The method includes a conductive feature formed over a semiconductor substrate and a metal-insulator-metal (MIM) capacitor device formed over and electrically connected to the conductive feature. The MIM capacitor has a bottom electrode layer and a top electrode layer that are separated by a superlattice multi-layer structure including first dielectric layers and second dielectric layers that are in an alternate arrangement. The second dielectric layer has a different lattice constant and a different thickness than the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a first insulating layer formed over a semiconductor substrate;
an interconnect structure formed in the first insulating layer;
a second insulating layer formed over the first insulating layer; and
a capacitor device embedded in the second insulating layer, comprising:
a first capacitor electrode layer electrically connected to the interconnect structure;
a capacitor insulating stack formed over the first capacitor electrode layer and comprising a plurality of first layers alternatingly stacked with a plurality of second layers, wherein a dielectric constant of the first layer is different than a dielectric constant of the second layer; and
a second capacitor electrode layer formed over the capacitor insulating stack,
wherein a lowermost first layer of the first layers is in direct contact with the first capacitor electrode layer and each of the first layers is thinner than each of the second layers;
a third insulating layer separating the interconnect structure from the first capacitor electrode layer; and
a via formed in the third insulating layer and capped by the first capacitor electrode layer, wherein the via is electrically connected between the first capacitor electrode layer and the interconnect structure.

2. The semiconductor device structure as claimed in claim 1, wherein a number of first layers is equal to a number of second layers, and the number of first layers is greater than 2.

3. The semiconductor device structure as claimed in claim 2, wherein the capacitor insulating stack further comprises a third layer formed over the plurality of first layers and the plurality of second layers, and wherein the third layer is made of a material that is the same as a material of the first layer.

4. The semiconductor device structure as claimed in claim 3, wherein the third layer is between and in direct contact with the second capacitor electrode layer and one of the second layers.

5. The semiconductor device structure as claimed in claim 4, wherein the third layer is thinner than the second layer.

6. The semiconductor device structure as claimed in claim 1, wherein a lattice constant of the first layer is different than a lattice constant of the second layer.

7. A semiconductor device structure, comprising:
a first insulating layer formed over a semiconductor substrate;
a capacitor device embedded in the first insulating layer, comprising:
a first metal electrode layer;
a second metal electrode layer formed over the first metal electrode layer; and
a plurality of first capacitor dielectric layers alternatingly stacked with a plurality of second capacitor dielectric layers, wherein the plurality of first capacitor dielectric layers and the plurality of second capacitor dielectric layers are formed between the first metal electrode layer and the second metal electrode layer, and wherein the first capacitor dielectric layer is made of $HfO_2$, and the second capacitor dielectric layer is made of $ZrO_2$;
a second insulating layer formed below the first insulating layer; and
a redistribution structure embedded in the second insulating layer, comprising:
a first metal line electrically connected to the first metal electrode layer; and
a second metal line formed below the first metal line and electrically connected to a gate of a transistor.

8. The semiconductor device structure as claimed in claim 7, wherein a lowermost first capacitor dielectric layer is in direct contact with the first metal electrode layer and an uppermost second capacitor dielectric layer is in direct contact with the second metal electrode layer.

9. The semiconductor device structure as claimed in claim 7, wherein a lowermost second capacitor dielectric layer is in direct contact with the first metal electrode layer and an uppermost first capacitor dielectric layer is in direct contact with the second metal electrode layer.

10. The semiconductor device structure as claimed in claim 7, wherein a lowermost first capacitor dielectric layer is in direct contact with the first metal electrode layer and an uppermost first capacitor dielectric layer is in direct contact with the second metal electrode layer.

11. The semiconductor device structure as claimed in claim 7, wherein a lowermost second capacitor dielectric layer is in direct contact with the first metal electrode layer and an uppermost second capacitor dielectric layer is in direct contact with the second metal electrode layer.

12. The semiconductor device structure as claimed in claim 7, wherein the first capacitor dielectric layer has a first thickness and the second capacitor dielectric layer has a second thickness that is greater than the first thickness.

13. A semiconductor device structure, comprising:
a first transistor and a second transistor formed over a semiconductor substrate; and
a metal-insulator-metal (MIM) capacitor device formed over the first transistor and the second transistor, wherein the MIM capacitor device is electrically connected to a gate structure of the first transistor and is electrically isolated from source and drain regions of the first transistor and the second transistor,
wherein the MIM capacitor device has a bottom electrode layer and a top electrode layer that are separated by a superlattice multi-layer structure comprising a plurality of first dielectric layers and a plurality of second dielectric layers that are in an alternate arrangement, and
wherein the second dielectric layer has a different lattice constant and a different thickness than the first dielectric layer.

14. The semiconductor device structure as claimed in claim 13, wherein the first dielectric layer or the second dielectric layer is made of $HfO_2$, and the other is made of $ZrO_2$.

15. The semiconductor device structure as claimed in claim 14, wherein an uppermost layer of the plurality of first dielectric layers and a lowermost layer of the plurality of first dielectric layers are in direct contact with the top electrode layer and the bottom electric layer, respectively.

16. The semiconductor device structure as claimed in claim 13, wherein an uppermost layer of the plurality of second dielectric layers and a lowermost layer of the plurality of first dielectric layers are in direct contact with the top electrode layer and the bottom electric layer, respectively.

17. The semiconductor device structure as claimed in claim 13, wherein a first number of the plurality of first dielectric layers is equal to or greater than a second number of the plurality of second dielectric layers, and the second number is greater than 2.

18. The semiconductor device structure as claimed in claim 13, further comprising a conductive feature formed over the gate structure of the first transistor, wherein the conductive feature comprises a contact structure that is electrically connected between the gate structure of the first transistor and the bottom electrode layer.

19. The semiconductor device structure as claimed in claim 2,
wherein the first layer is made of $HfO_2$ and the second layer is made of $ZrO_2$.

20. The semiconductor device structure as claimed in claim 13, further comprising:
an interconnect structure formed over the first and second transistors;
an insulating layer separating the interconnect structure from the MIM capacitor device; and
a via formed in the insulating layer and capped by MIM capacitor device, wherein the MIM capacitor device is electrically connected to the gate structure of the first transistor through the via and the interconnect structure.

* * * * *